United States Patent [19]

Shirota et al.

[11] Patent Number: 5,038,569
[45] Date of Patent: Aug. 13, 1991

[54] THERMOELECTRIC CONVERTER

[75] Inventors: Yuichi Shirota, Anjo; Kazutoshi Nishizawa, Toyoake; Yoshitaka Tomatsu, Nagoya; Kenichi Fujiwara, Kariya; Hideo Ohta, Toyohashi; Kenji Yamada, Chiryu, all of Japan

[73] Assignee: Nippondenso Co., Ltd., Kariya, Japan

[21] Appl. No.: 510,262

[22] Filed: Apr. 17, 1990

[30] Foreign Application Priority Data

| Apr. 17, 1989 | [JP] | Japan | 1-96888 |
| Aug. 4, 1989 | [JP] | Japan | 1-203581 |
| Feb. 27, 1990 | [JP] | Japan | 2-47044 |
| Apr. 5, 1990 | [JP] | Japan | 2-90965 |

[51] Int. Cl.$^5$ .............................................. F25B 21/02
[52] U.S. Cl. .......................................... 62/3.2; 62/3.7
[58] Field of Search ...................... 62/3.1, 3.2, 3.3, 3.7

[56] References Cited

U.S. PATENT DOCUMENTS

| 2,992,538 | 7/1961 | Poganski | 62/3.7 |
| 2,992,539 | 7/1961 | Curtis | 62/3.7 |
| 3,254,494 | 6/1966 | Chartouni | 62/3.7 X |
| 3,635,037 | 1/1972 | Hubert | 62/3.2 |

FOREIGN PATENT DOCUMENTS 53-99796  8/1978  Japan .

Primary Examiner—Lloyd L. King
Attorney, Agent, or Firm—Cushman, Darby & Cushman

[57] ABSTRACT

A thermoelectric converter has a N-type thermoelectric element, a P-type thermoelectric element, an endothermic electrode and a radiative electrode. One surface of the N-type thermoelectric element is attached to one surface of the endothermic electrode and the other surface is attached to one surface of the radiative electrode. One surface of the P-type thermoelectric element is attached to the other surface of the radiative electrode and the other surface is attached to the other endothermic electrode.

29 Claims, 13 Drawing Sheets

THERMOELECTRIC CONVERTER

BACKGROUND OF THE INVENTION

Field of the Invention

The present invention relates to a thermoelectric converter which could be compact and has high nonconductivity.

A conventional thermoelectric converter which is shown in Japanese unexamined Patent (Kokai) No. 53-99796, as shown in FIG. 27, has a thermoelectric converting portion 80, an endothermic heat exchanger 81 and a radiative heat exchanger 82 for radiating and absorbing heat by the Peltier effect. The thermoelectric converting portion 80 comprises a plurality of P-type thermoelectric elements (P-type semiconductor) $1p'$ and N-type thermoelectric elements (N-type semiconductor) $1n'$ which are disposed one after the other, a plurality of endothermic electrodes 83 which connect an end of the P-type thermoelectric element $1p'$ with an end of the N-type thermoelectric element $1n'$ and a plurality of radiative electrodes 84 which connect the other end of the P-type thermoelectric element $1p'$ with the other end of the N-type thermoelectric element $1n'$.

The endothermic heat exchanger 81 includes a insulating plate 85 which is thermally connected to the endothermic electrodes 83, and an endothermic metal plate 86 which is thermally connected to the insulating plate 85.

The radiative heat exchanger 82 includes an insulating plate 87 which is thermally connected to the radiative electrode 84, and a radiative metal plate 88 which is thermally connected to the insulating plate 87.

The radiative electrode $84a$ is connected to a negative pole of an electric supply (not shown) and the radiative electrode $84b$ is connected to a positive pole. The endothermic electrodes 83 absorb heat, and then the endothermic metal plate 86 is cooled. The radiative electrodes 84 radiate heat, and then the radiative metal plate 88 is heated.

In the conventional device described above, the insulating plates 85 and 87 are disposed between the electrodes 83 and 84 and the metal plates 86 and 88 in order to prevent short-circuits between the adjacent endothermic electrodes 83 and the adjacent radiative electrodes 84. The insulating plates 85, 87 decrease the efficiency of radiating and absorbing heat due to the thermal resistance of the insulating plates 85, 87 and the contacting thermal resistance between the endothermic metal plate 86 and the insulating plate 85, the insulating plate 85 and the endothermic electrode 83, the radiative electrode 84 and the insulating plate 87, the insulating plate 87 and the radiative plate 88.

Since an electric current flows through each of electrodes 83, 84, Joule heat is generated due to the electric resistance of electrodes 83, 84 and the efficiency of cooling is decreased. The cross sectional area of the electrodes 83, 84 across the direction of the electric current is small and the length of the electrodes 83, 84 along the direction of the electric current is long, so the electric resistance becomes larger and the Joule heat increases.

If the length of the electrodes 83, 84 becomes shorter, a short circuit might be caused between adjacent electrodes 83 and/or between adjacent electrodes 84. For instance, when the length of the endothermic electrode 83 becomes shorter, two of the radiative electrodes 84 come closer. In other words, enough distance between adjacent electrodes is required to avoid a short circuit, so that it is hard to make the device compact.

If adjacent electrodes short circuit, the thermoelectric elements could not radiate or absorb heat.

SUMMARY OF THE INVENTION

An object of this invention is to provide a compact thermoelectric converter without causing short circuiting, but instead causing nonconductivity, between adjacent radiative electrodes and between adjacent endothermic electrodes.

The thermoelectric converter of the present invention comprises a thermoelectric converting portion, an endothermic heat exchanging portion which is disposed on a side of the thermoelectric converting portion and a radiative heat exchanging portion which is disposed on the other side of the thermoelectric converting portion. The thermoelectric converting portion has N-type thermoelectric elements, endothermic electrodes, P-type thermoelectric elements and radiative electrodes which are built up sequentially. The endothermic heat exchanging portions are thermally connected to the endothermic electrodes and the radiative heat exchanging portions are thermally connected to the radiative electrodes.

A direct voltage is applied to both ends of the thermoelectric converting portion and a direct current flows sequentially through the N-type thermoelectric elements, the endothermic electrodes, the P-type thermoelectric elements and the radiative electrodes. Due to the Peltier effect, each of the endothermic electrodes becomes lower in temperature at and around the surfaces contacting the thermoelectric elements, and the endothermic heat exchangers absorb the heat. Each of radiative electrodes becomes higher in temperature at and around the surfaces contacting the thermoelectric elements and the radiative heat exchangers radiate the heat.

There are always a radiative or endothermic electrode and a P-type or N-type thermoelectric element between two of adjacent endothermic electrodes. The nonconductivities between adjacent endothermic electrodes and adjacent radiative electrodes are kept high even if the P-type and the N-type thermoelectric elements become smaller.

Other objects, advantages and complete structures of the invention will become more apparent from the following description and appended claims.

DETAILED DESCRIPTION OF THE PREFERRED EMBODIMENT

Various embodiments of the present invention are described hereinafter. In each embodiment, parts which have the same function have the same numeral.

THE FIRST EMBODIMENT

Figure 1:
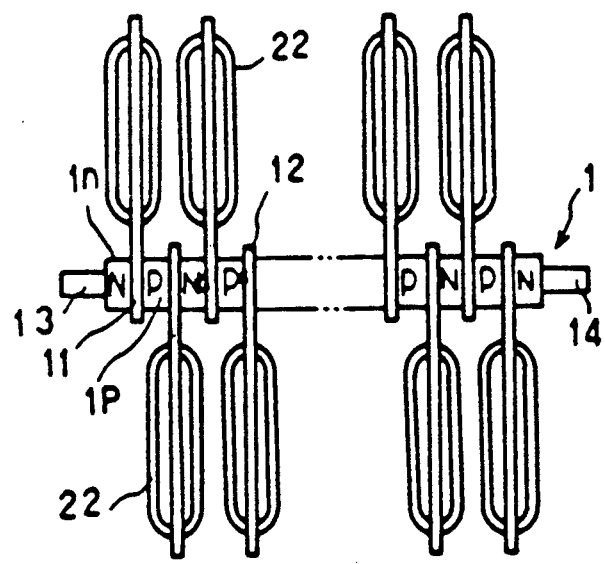
FIG. 1 is a front view of the first embodiment of the thermoelectric converter with center portions taken away.

The first embodiment of the present invention is described in FIG. 1.

The thermoelectric converter has a thermoelectric converting portion 1. The thermoelectric converting portion 1 comprises N-type thermoelectric elements 1n, endothermic electrodes 11, P-type thermoelectric elements 1p and radiative electrodes 12. The N-type thermoelectric element 1n, the endothermic electrodes 11, the P-type thermoelectric elements 1p and the radiative electrodes 12 are built up sequentially in this order. The thermoelectric converting portion 1 has plural groups of those elements and electrodes. The N-type thermoelectric elements 1n and the P-type thermoelectric elements 1p are connected to the endothermic electrodes 11 and the radiative electrodes 12 by soldering. A positive electrode 13 and a negative electrode 14 are respectively connected to opposite ends of the thermoelectric converting portion 1.

N-type semiconductors and P-type semiconductors made from bismuth-tellurium material are respectively used as N-type thermoelectric elements 1n and P-type thermoelectric elements 1p and have exemplary dimensions of 3mm×3mm×1.3mm.

Figure 2:
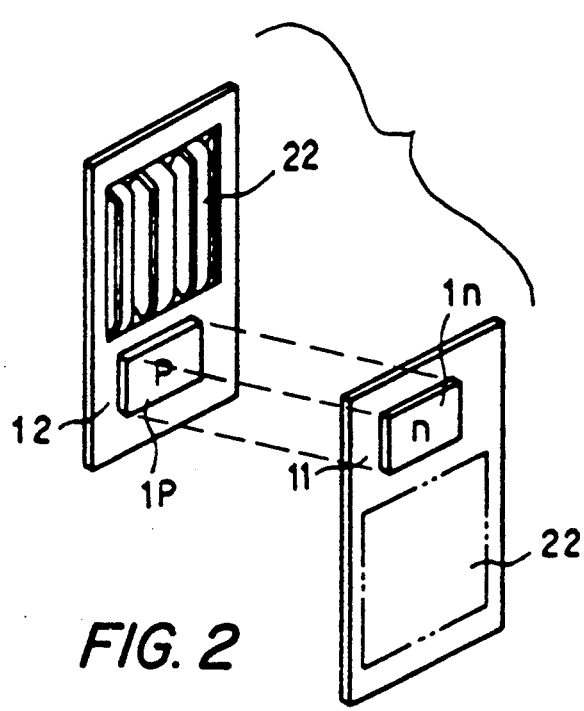
FIG. 2 is a perspective view of a part of the first embodiment.

The endothermic electrodes 11 and the radiative electrodes 12 are rectangular shape of 3 cm×2 cm×1 mm for example, and are made of copper alloy. The N-type thermoelectric elements 1n are connected to a surface of the endothermic electrodes 11 and the radiative electrodes 12 by soldering. The P-type thermoelectric elements 1p are connected to the other surface of the endothermic electrodes 11 and the radiative electrodes 12 by soldering. The endothermic electrodes 11 and the radiative electrodes 12 have a heat exchanging portion wherein louvers 22 are formed, as shown in FIG. 2. The louvers 22 include a plurality of strips which are parallel to the longitudinal axis of the electrodes 11, 12. The louvers 22 of the endothermic electrode 11 is not shown in FIG. 2. The adjacent louvers 22 extend in opposite directions to each other as shown in FIG. 1. The electrodes 11, 12 are disposed perpendicularly to the built-up or longitudinal direction of the thermoelectric elements 1p, 1n in such a manner that the endothermic electrodes 11 and the radiative electrodes 12 extend in opposite directions to each other.

This thermoelectric converter is assembled in a way described hereinafter. One surface of the endothermic electrode 11 and one surface of the N-type thermoelectric element 1n are soldered to each other, and one surface of the radiative electrode 12 and one surface of the P-type thermoelectric element 1p are soldered to each other. Then, the other surface of endothermic electrode 11 and the other surface of the P-type thermoelectric element 1p are soldered to each other, and the other surface of the radiative electrode 12 and the other surface of the N-type thermoelectric element 1n are soldered to each other. Finally, the positive electrode 13 and the negative electrode 14 are soldered at opposite ends of the thermoelectric converting portion 1.

The operation of the thermoelectric converter is described hereinafter.

A nonconductive fluid to be cooled flows through the louvers 22 of the endothermic electrode 11 and a nonconductive coolant flows through the louvers 22 of the radiative electrode 12. An insulating member (not shown) is disposed at the thermoelectric converting portion to prevent the fluid to be cooled and the coolant from mixing physically and thermally with each other.

When direct current is applied between the positive electrode 13 and the negative electrode 14, the surfaces of the endothermic electrodes 11 which contact the P-type thermoelectric element 1p and also the N-type thermoelectric element 1n and the vicinity around those contacting surfaces become cooler due to the Peltier effect, and then the endothermic electrodes 11 absorb heat from the fluid to be cooled through the louvers 22. The surfaces of the radiative electrodes 12 which contact both of the thermoelectric elements 1p, 1n and the vicinity around those contacting surfaces become hotter due to the Peltier effect, and then the radiative electrodes 12 radiate the heat toward the coolant through the louvers 22. The heat absorbed from the fluid to be cooled and the Joule heat generated at the P-type and N-type thermoelectric elements 1p and 1n are transferred to the coolant.

According to the thermoelectric converter of the first embodiment:

(A) Since the endothermic electrodes 11 of the heat absorbing portion (the endothermic heat exchanger in the present invention) and the radiative electrodes 11 of the heat radiating portion (the radiative heat exchanger in the present invention), the heat is easily transferred from the thermoelectric converting portion 1 to the heat radiative portion and from the heat absorbing portion to the thermoelectric converting portion 1.

(B) Since direct current flows in the direction of stacking of the thermoelectric elements 1p, 1n, since the cross sectional areas of the electrodes 11, 12 across the direction of the current are relatively large, and since the flowing distance of current is a thickness of the electrodes 11, 12, the loss of electricity due to the electric resistance and the amount of the Joule heat are both reduced.

Figure 27:
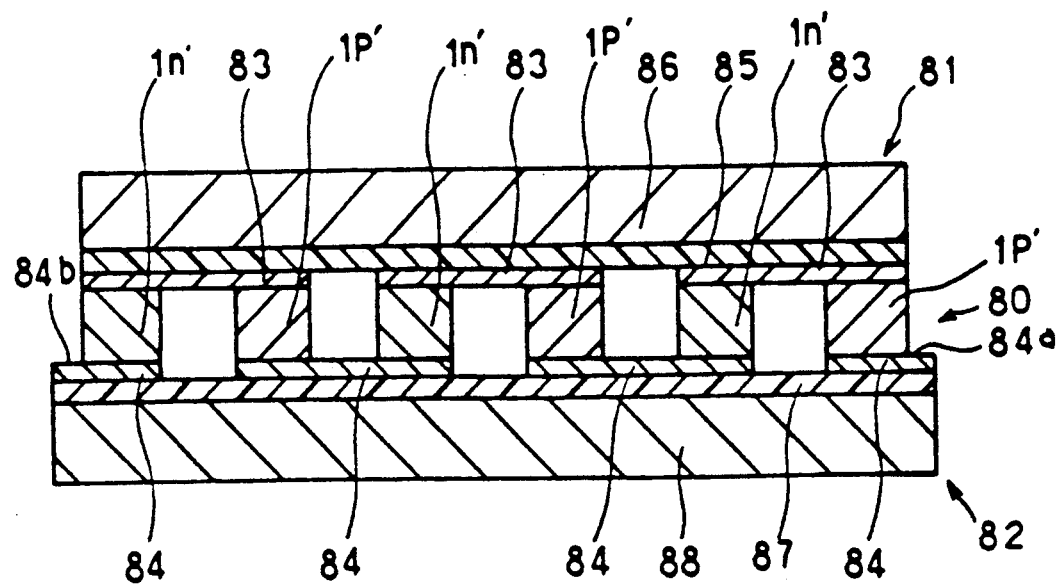
FIG. 27 is a cross sectional view of a conventional thermoelectric converter.

Since any two of the adjacent endothermic electrodes 11 or of the radiative electrodes 12 which have different voltage are not disposed on the same insulating member as in the conventional device shown in FIG. 27, the electric insulation is easily achieved even though the size of the device becomes small.

(C) Since the endothermic electrodes 11 and the radiative electrodes 12 absorb and radiate heat at both surfaces thereof, the surface areas of electrodes 11, 12 required to absorb and radiate the heat sufficiently becomes half as compared with the conventional device which radiate and absorb the heat at just one surface of the electrodes.

(D) Insulating members are not required between the thermoelectric elements and the electrodes 11, 12 as in the conventional device shown in FIG. 27. There is no worry about the heat resistance due to the insulating members.

(E) In the conventional device shown in FIG. 27, each thermoelectric element 1p', 1n' is aligned on the flat surfaces of the insulating plates 85, 87. If the widths of the thermoelectric element 1n', 1p' are not even, it is difficult to contact the thermoelectric elements 1n', 1p' with the insulating plates 85, 87. The present invention does not have such a problem.

Other modifications of the electrodes 11, 12 can be applied. For instance, the electrodes 11, 12 can have fins instead of louvers 22. A heat pipe can be formed by the electrodes 11, 12 or a heat pipe can be provided to the electrodes 11, 12. FIGS. 3 through 7 show these modifications of the electrodes 11, 12.

Figure 3:
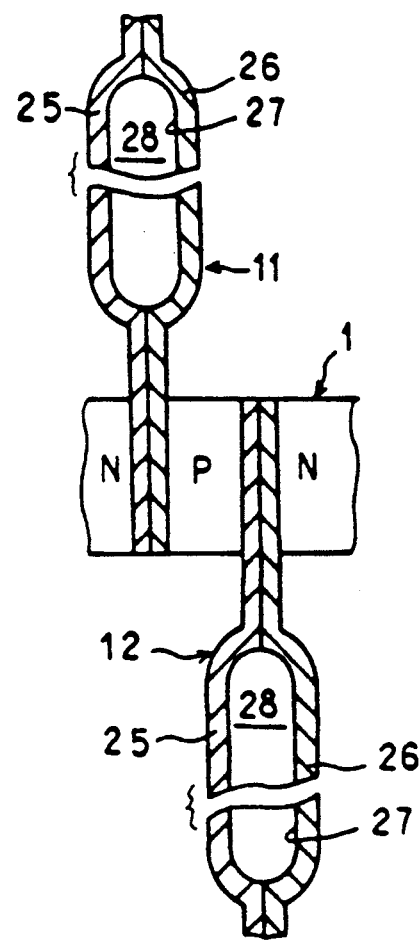
FIGS. 3, 4, 5 and 6 are cross sectional views of different types of the first embodiment.

FIG. 3 shows one of the modifications of electrodes 11, 12 wherein each of the endothermic electrodes 11 and each of the radiative electrodes 12 form the heat pipe thereby. Each electrode 11, 12 has a pair of rectangular metal plates 25, 26 which are joined by soldering the peripheries thereof. These metal plates 25, 26 have flat surfaces or tongues at their one end where the thermoelectric elements 1n, 1p are connected and a concaved portion 27 at the other end and center portion thereof. Two concaved portions 27 confront each other to form a closed space 28 which has a flat cross sectional shape and into which refrigerant, fluorocarbon R21, is introduced. The refrigerant evaporates at one end of the closed space 28 which is further from the thermoelectric converting portion 1 (e.g., at the top end of electrode 11 in FIG. 3) and then the evaporated refrigerant is liquefied at the other end of the closed space 28 which is closer to the thermoelectric converting portion 1. The liquefied refrigerant flows back to the end by a capillary phenomenon. These operations are carried out repeatedly as a heat pipe, and the heat transfer capacity is increased by utilizing a latent heat of the refrigerant.

Figure 4:
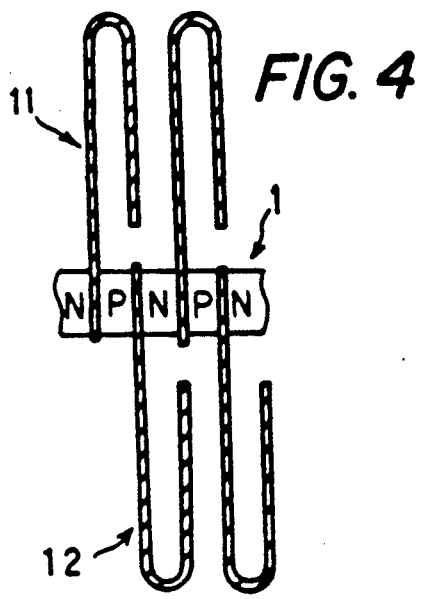

FIG. 4 shows another modification of the electrodes 11, 12 wherein the electrodes 11, 12 are made of copper alloy and have U-shape. The electrodes 11, 12 are bent into a U-shape at the center portion in such a manner that a free end thereof comes close to the thermoelectric element 7.

Figure 5:
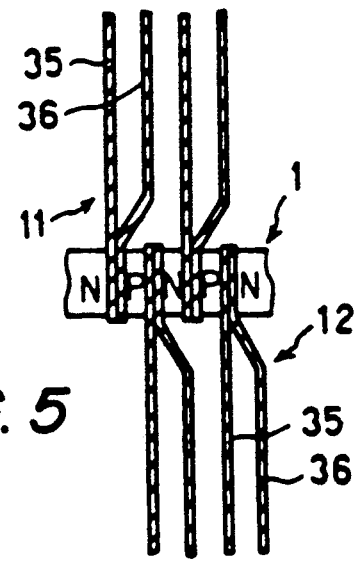

FIG. 5 shows a further modification of the electrodes 11, 12 wherein the electrodes 11, 12 comprise a flat plate 35 and a bent plate 36. The bent plate 36 is disposed between two adjacent flat plates 35 in parallel.

To avoid contact of adjacent electrodes 11, 12, it is useful to provide a spacer (not shown) made from nonconductive material between electrodes 11, 12 or provide a nonconductive coating on the heat exchanging portion of the electrodes 11, 12. Even if the heat exchanging portion is deformed, the electric insulation is achieved well.

Figure 6:
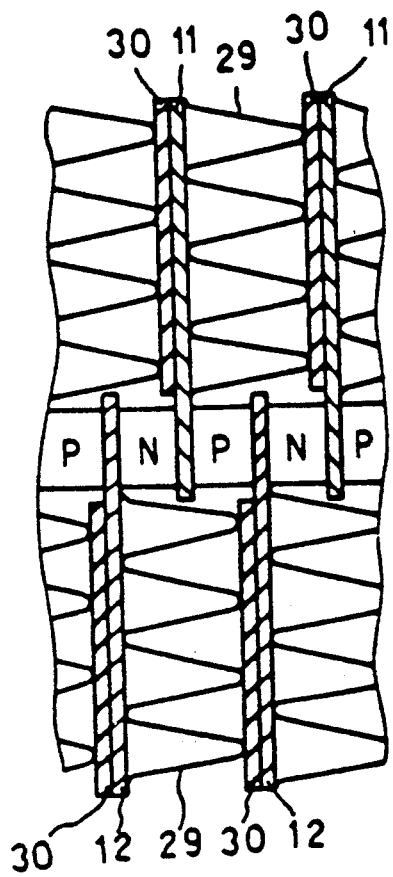

FIG. 6 shows still another modification of electrodes 11, 12 wherein corrugated fins made from copper are disposed between adjacent electrodes 11, 12. The electric insulating plates 30 are also provided on one surface of the electrodes 11, 12.

When the electrodes 11, 12 are made from aluminum, aluminum layers can be applied on the electrodes 11, 12 instead of the electric insulating plate 30.

Figure 28:
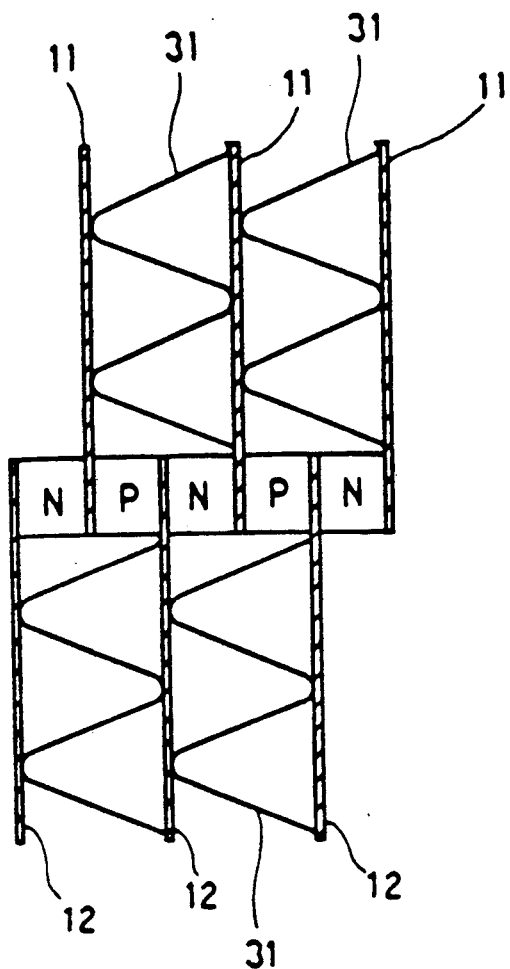
FIG. 28 is a cross sectional view of the first embodiment.
Figure 29:
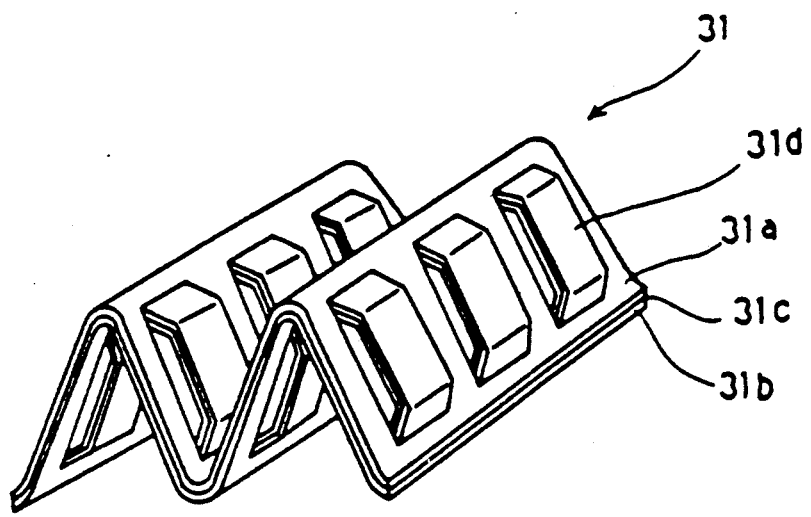
FIG. 29 is a perspective view of a corrugated fin shown in FIG. 28, FIGS. 30 and 31 are front views of the other modification of the fourth embodiment.

FIGS. 28 and 29 show a modification of the corrugated fins. Corrugated fins 31 include a copper layer 31a, a copper layer 31b and a nonconductive resin layer 31c which is held by the copper layer 31a and the copper layer 31b. The copper layers 31a, 31b and the resin layer 31c are elastic and are combined by an adhesive. The corrugated fins 31 have louvers 31d thereon and are attached to the adjacent electrodes 11, 12 by soldering or brazing on both sides. Therefore, the mechanical strength of the corrugated fins 31 and the electrodes 11, 12 is increased and the heat transfer efficiency increases.

The fins 31 can be made from aluminum alloy instead of copper alloy.

THE SECOND EMBODIMENT

Figure 7:
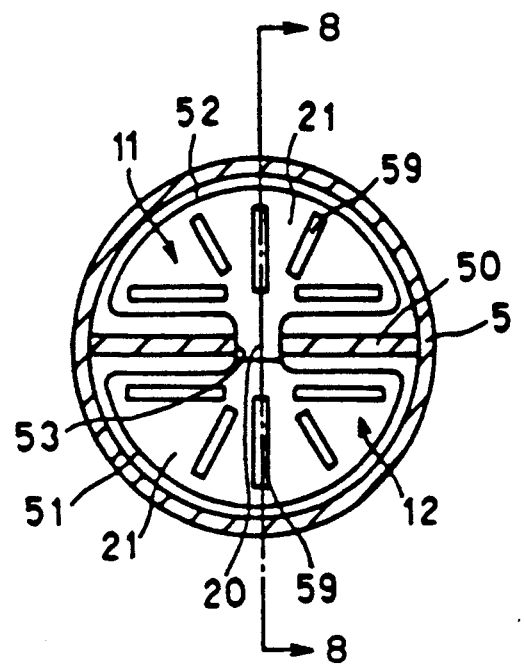
FIG. 7 is a cross sectional view of the second embodiment of the thermoelectric converter.
Figure 8:
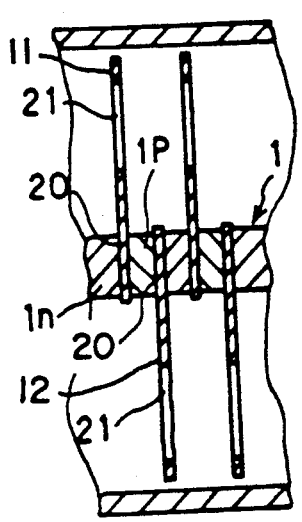
FIG. 8 is a cross sectional view taken along the line 8—8 of FIG. 7.

The second embodiment of the present invention is now described. FIG. 7 is a cross sectional view of the second embodiment and FIG. 8 is a cross sectional view taken along the line 8—8 of FIG. 7.

The thermoelectric converting portion 1 comprises the N-type thermoelectric element 1n, the endothermic electrodes 11, the P-type thermoelectric elements 1p and the radiative electrodes 12 all of which are disposed in a cylindrical duct 5. The duct 5 has a central partition 50 on an axis thereof which divides an inner space of the duct 5 into a radiative fluid passage 51 and an endothermic fluid passage 52. The central partition 50 has a rectangular opening 53 into which the thermoelectric converting portion 1 is disposed. The longitudinal axis of the thermoelectric converting portion 1 is coincident with the axis of the duct 5.

Each of the electrodes 11, 12 has a square contacting portion 20 to which the N-type thermoelectric elements 1n and the P-type thermoelectric elements 1p are in contact and a fan-shaped heat exchanging portion 21 which elongates from a side of the square contacting portion 20 and is made from copper. A plurality of openings 59 are formed radially with respect to the contacting portion 20 in the heat exchanging portion 21 of the endothermic electrode 11 and a fluid to be cooled can flow through the openings 59 in the duct 5. The radiative electrode 12 has the same fan shape as that of the endothermic electrode 11 but are headed in the opposite direction to the endothermic electrode 11.

According to this embodiment, since the central partition 50 supports the thermoelectric converting portion 1, the supporting structure becomes simple and does not interfere with heat transfer.

Figure 9:
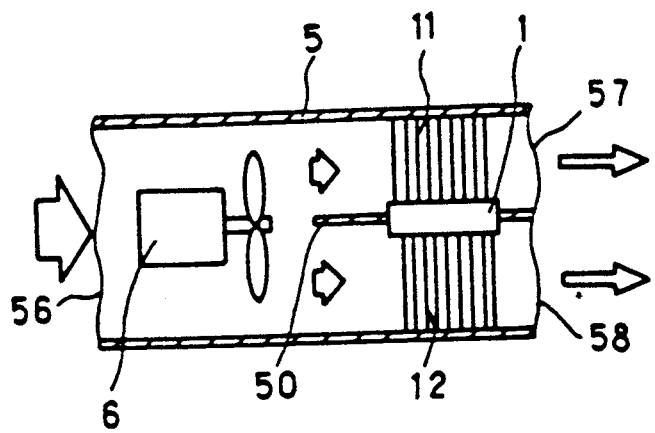
FIG. 9 is a partially schematic, cross sectional view of an air conditioner for an automobile to which the second embodiment is applied.

FIG. 9 shows an air conditioner for an automobile to which the second embodiment is applied. A fan 6 is provided upperstream of the duct 5 and the thermoelectric converter of the present embodiment is provided downstream of the duct 5. The duct 5 has a common intake 56, a cooled air outlet 57 and a warmed air outlet 58.

Fresh-air or a air from inside the automobile is introduced into the duct 5 through the common intake 56 by the fan 6. The air cooled by the endothermic electrodes 11 and the air warmed by the radiative electrode 12 are mixed by controlled valves (not shown) together in a desired proportion and the mixed air is introduced into the automobile.

A plurality of thermoelectric element 1p, 1n can be attached to each of electrodes 11, 12.

THE THIRD EMBODIMENT

Figure 10:
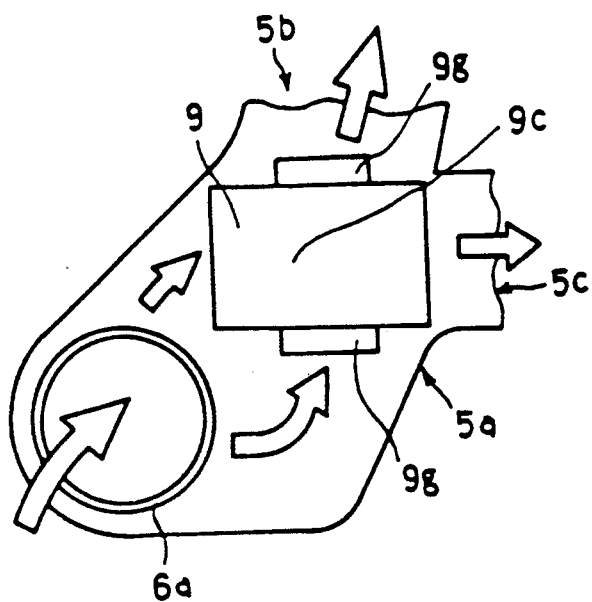
FIG. 10 is a partially schematic, cross sectional view of an air-conditioner for an automobile to which the third embodiment is applied.
Figure 12:
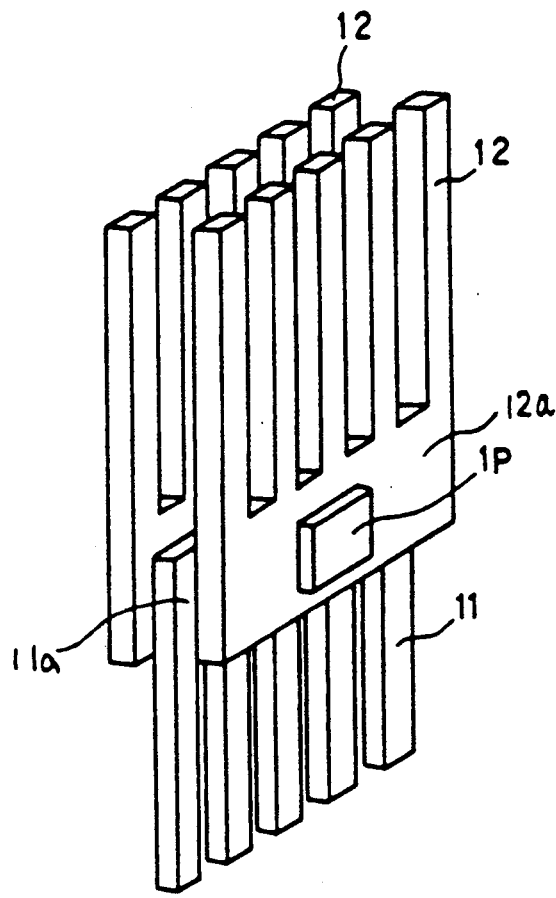
FIG. 12 is a perspective view showing a thermoelectric converting portion of the third embodiment.
Figure 11:
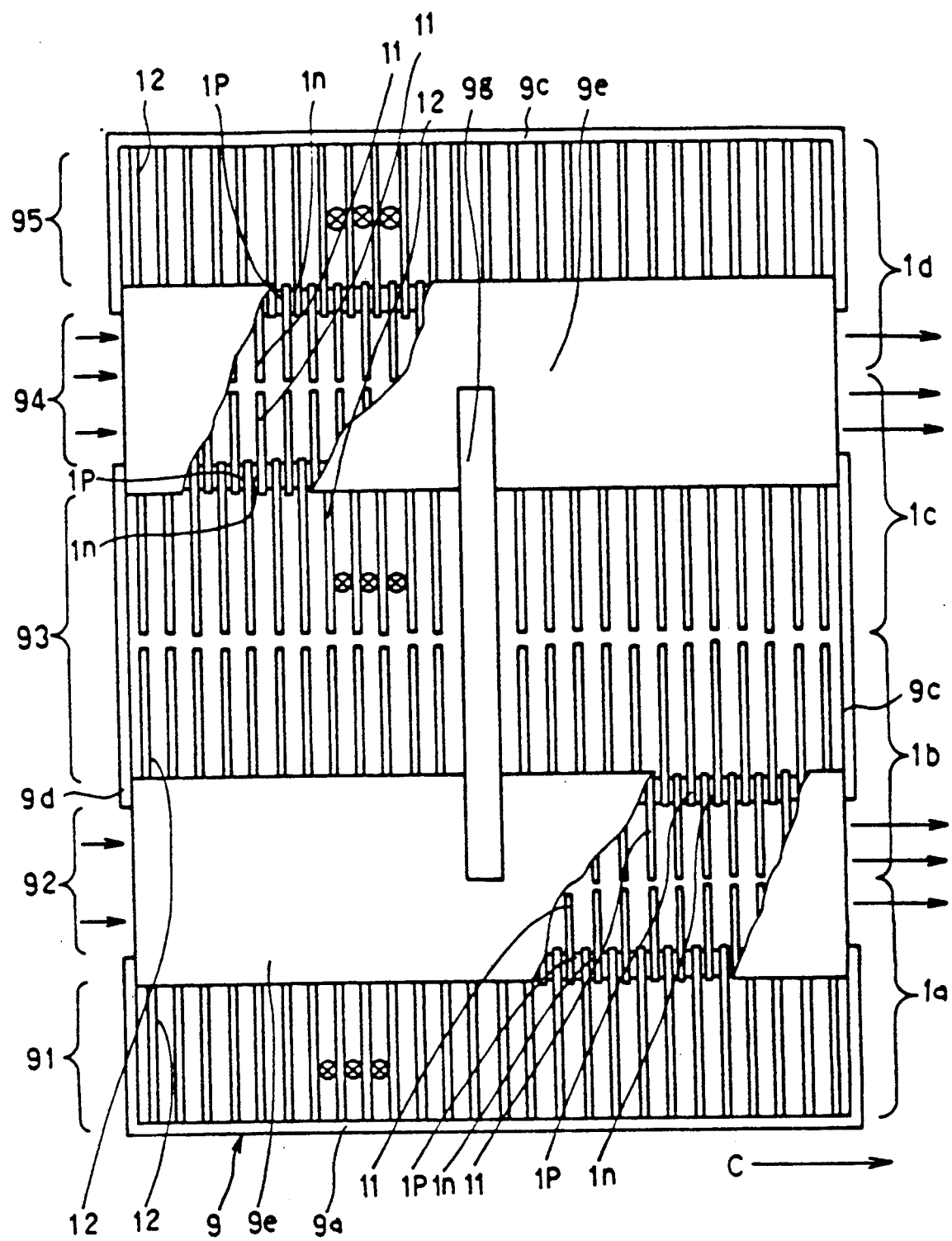
FIG. 11 is a front view of the third embodiment with parts broken away.

The third embodiment of the present invention is described in FIGS. 10 through FIGS. 12. FIG. 11 is a front view with parts broken away. Four thermoelectric converting portions 1a through 1d are built up vertically against the longitudinal axis thereof and are provided in a case 9 made from nonconductive resin. Each of the thermoelectric converting portion 1a through 1d include the N-type thermoelectric elements 1n, the endothermic electrodes 11, the P-type thermoelectric elements 1p and the radiative electrodes 12.

Each electrode 11, 12 is comb-shaped as shown in FIG. 12. The N-type thermoelectric element 1n and the P-type thermoelectric element 1p are attached to base portions 11a, 12a of the electrodes 11, 12 by soldering in such a manner that the N-type and P-type thermoelectric elements 1n and 1p are in a line. The endothermic electrodes 11 and the radiative electrodes 12 are headed in opposite directions relative to each other.

One end of each radiative electrode 12 of the thermoelectric converting portion 1a which is located at the bottom is in contact with a bottom plate 9a of the case 9. One end of each endothermic electrode 11 confronts one end of a respective endothermic electrode 11 of the thermoelectric converting portion 1b which is located next to the converting portion 1a. One end of each radiative electrode 12 of the thermoelectric converting portion 1b confronts one end of a respective radiative electrode 12 of the thermoelectric converting portion 1c. One end of each endothermic electrode 11 of the thermoelectric converting portion 1c confronts one end of a respective endothermic electrode 11 of the thermoelectric converting portion 1d. One end of each radiative electrode 12 of the thermoelectric converting portion 1d which is located the furthest up is attached to an upper plate 9c of the case 9.

Partition plates (not shown) are disposed in the case 9 perpendicularly to the sheet of drawing for FIG. 11 in such a manner that the inner space of the case 9 is divided into a first radiative passage 91, a second radiative passage 93, a third radiative passage 95, a first endothermic passage 92 and a second endothermic passage 94. The radiative electrodes 12 are located in each of the radiative passages 91, 93, 95 and the endothermic electrodes 11 are located in each of the endothermic passages 92, 94. Especially, two rows of the radiative electrodes 12, 12 of the thermoelectric converting portion 1b, 1c are located in the second radiative passage 93. Similarly, in the first and the second endothermic passage 92, 94, two rows of the endothermic electrodes 11 are located respectively.

The direction of air flowing through each radiative passages 91, 93, 95 is perpendicular to the sheet of drawing for FIG. 11. Air flowing through each endothermic passage 92, 94 flows from left to right in FIG. 11. Front plates 9e and a rear plates (not shown) are disposed at front and rear ends of the endothermic passages 92, 94 to close both ends, and side plates 9e, 9d are disposed at both sides of the radiative passages 91, 93, 95 to close both sides.

A supporting plate 9g is attached to both of the front plates 9e, 9e and a similar shaped supporting plate (not shown) is attached to both of the rear plates. The whole thermoelectric converter including case 9 is fixed in a duct 5a (shown in FIG. 10).

FIG. 10 shows an air conditioner for an automobile to which this embodiment is applied. The thermoelectric converter is located downstream of the duct 5a and a fan 6a is located upstream of the duct 5a. The air pulled in by the fan 6a is divided into two streams which cross vertically of each other and are introduced into a warmed air duct 5b and a cooled air duct 5c through the radiative passages 91, 93, 95 and the endothermic passages 92, 94 respectively. According to the present embodiment, since the radiative and the endothermic passages 91, 93, 95 and 92, 94 cross each other perpendicularly, the warmed air and the cooled air are easily separated. The same kind of electrodes located in the same passage can be combined. For example, the endothermic electrodes 11 of converting portion 1a and those of converting portion 1b are both in passage 92, and each set of two opposing electrodes 11 in that passage can be combined into one continuous electrode. The same can be done in passages 93 and 94.

Figure 13:
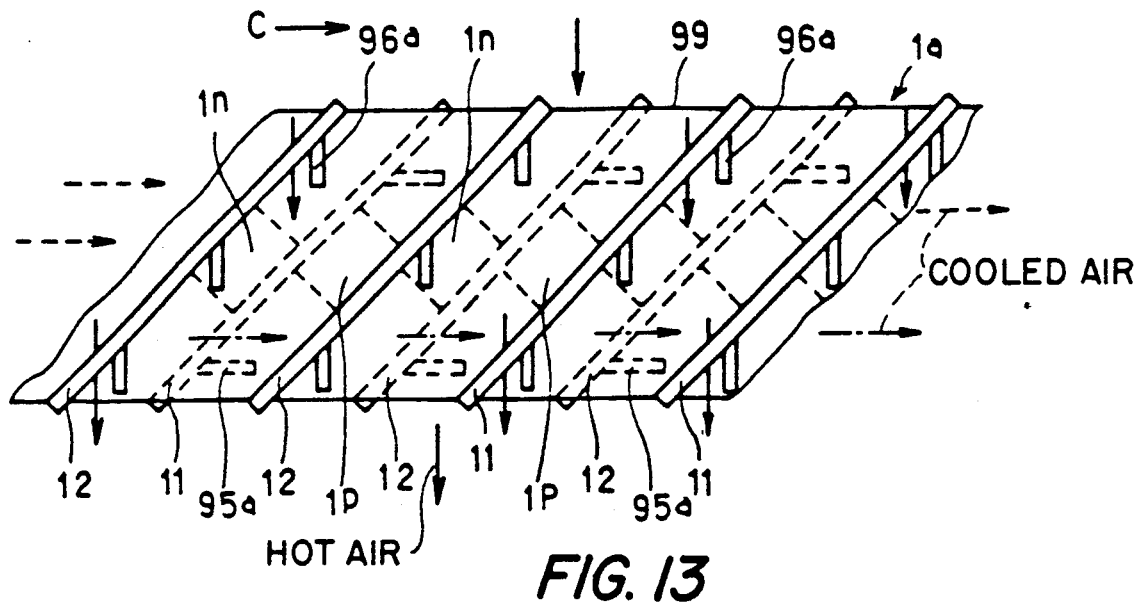
FIG. 13 is a perspective view showing a modification of a thermoelectric converting portion of the third embodiment.
Figure 14:
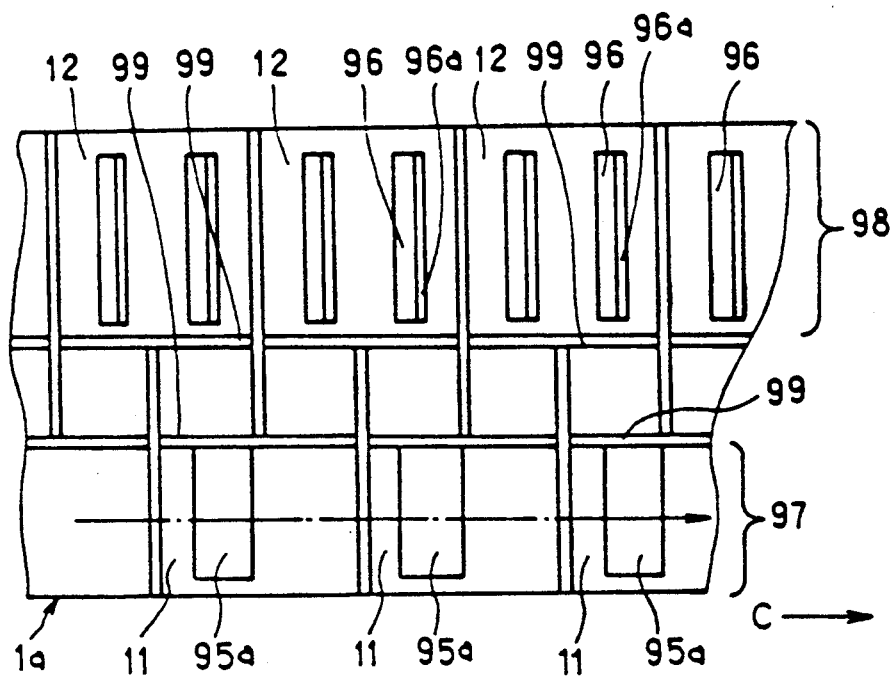
FIG. 14 is a front view of the thermoelectric converting portion shown in FIG. 13.

FIGS. 13 and 14 show a modification of the thermoelectric converting portion useable in any of the embodiments disclosed above and below. The endothermic electrodes 11 and the radiative electrodes 12 are inclined 45° relative to the direction C (shown in FIG. 11 as well as FIGS. 13 and 14) in which the N-type thermoelectric element 1n and the P-type thermoelectric elements 1p are lined. Thermal nonconductive plates 99 are disposed between two adjacent endothermic electrodes 11 and two adjacent radiative electrodes 12 respectively to make a warmed air passage and a cooled air passage.

Each radiative electrode 12 has rectangular openings 96 and guide louvers 96a at edges of the openings 96. Each endothermic electrode 11 has rectangular openings (not shown) and guide louvers 95a at edges of the openings. The louvers 95a are parallel to the direction C and the louvers 96a are perpendicular to the direction C. The louvers 95a, 96a are made by bending strips to make openings. The cooled air passing through the endothermic electrodes 11 flows parallel to the direction C and the warmed air passing through the radiative electrodes 12 flows perpendicularly to the direction C. Cooled air exits the right end in FIG. 13 and warmed air exits the bottom side.

Figure 15:
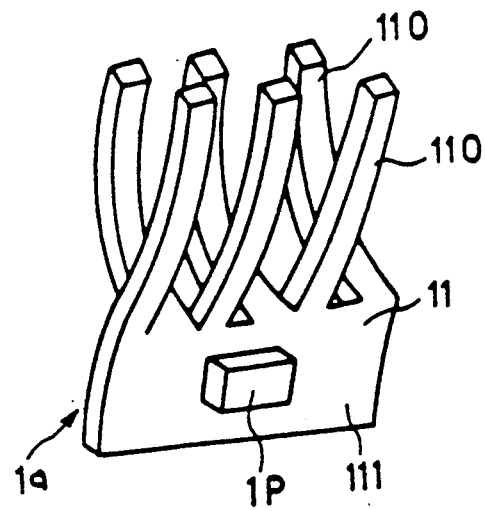
FIG. 15 is a perspective view showing a further modification of a thermoelectric converting portion of the third embodiment.

FIG. 15 shows a modification of the endothermic electrode 11. The endothermic electrodes 11 have a plurality of strips 110 extending from a base portion 111 to which thermoelectric elements 1p, 1n are attached. Adjacent strips are bent in opposite directions, continuously and symmetrically with respect to the base portion 111. The direction of air passing through the endothermic electrode 11 is not restricted.

THE FOURTH EMBODIMENT

Figure 16:
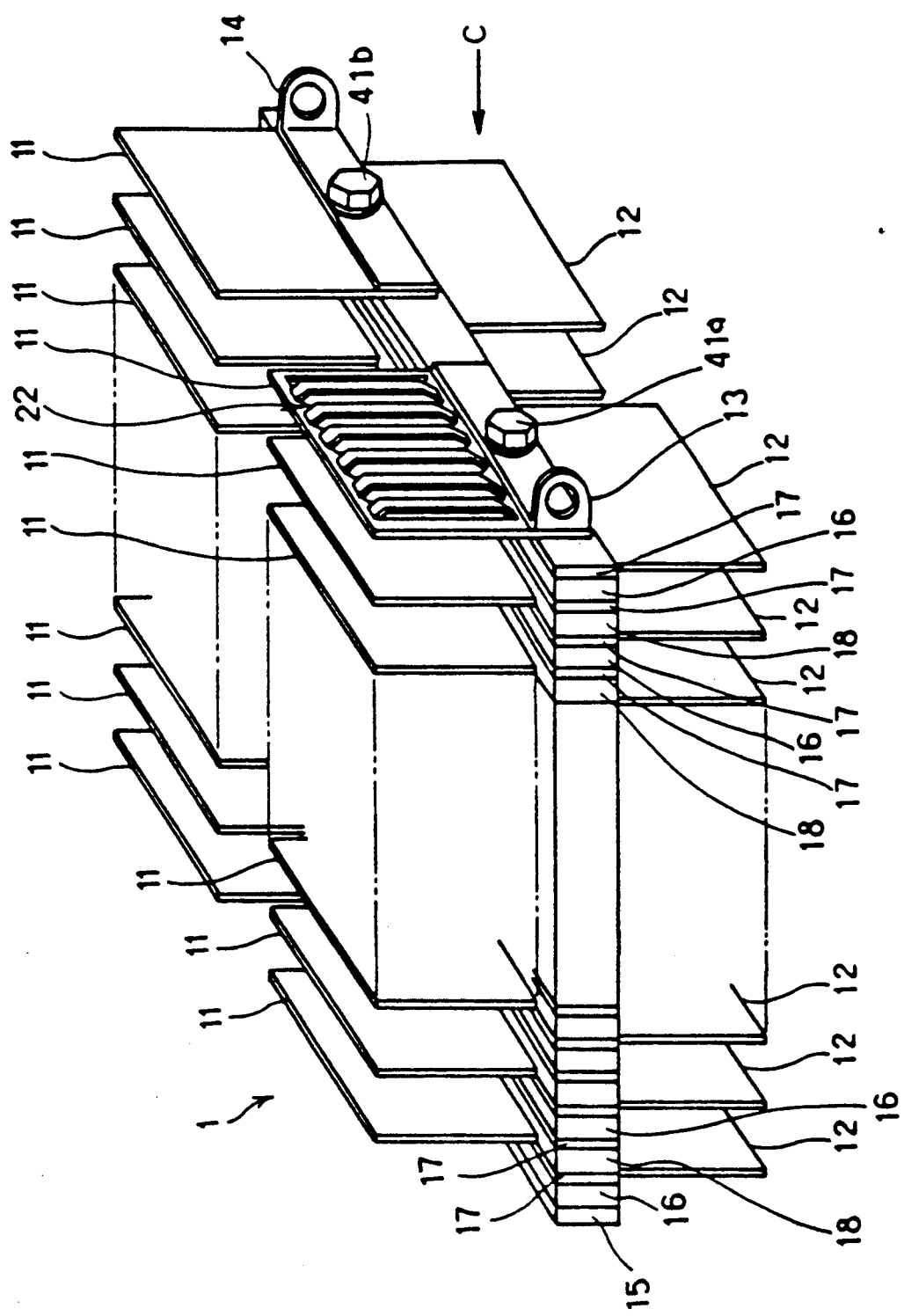
FIG. 16 is a perspective view of the fourth embodiment of the thermoelectric converter with center portions taken away.
Figure 18:
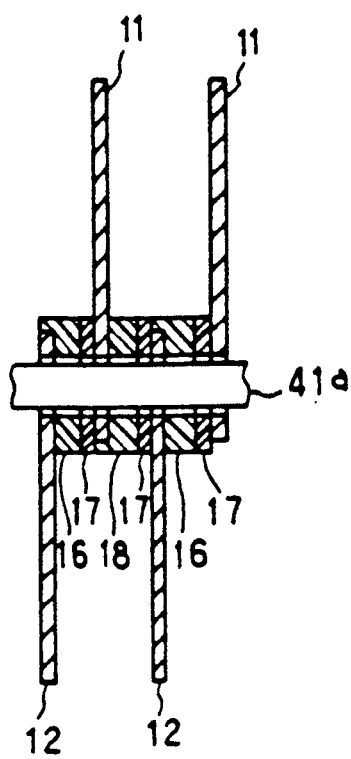
FIG. 18 is a cross sectional view taken along the line 18—18 of FIG. 17.
Figure 19:
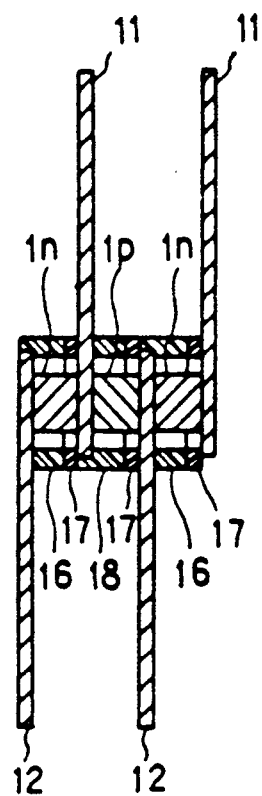
FIG. 19 is a cross sectional view taken along the line 19—19 of FIG. 17.
Figure 20:
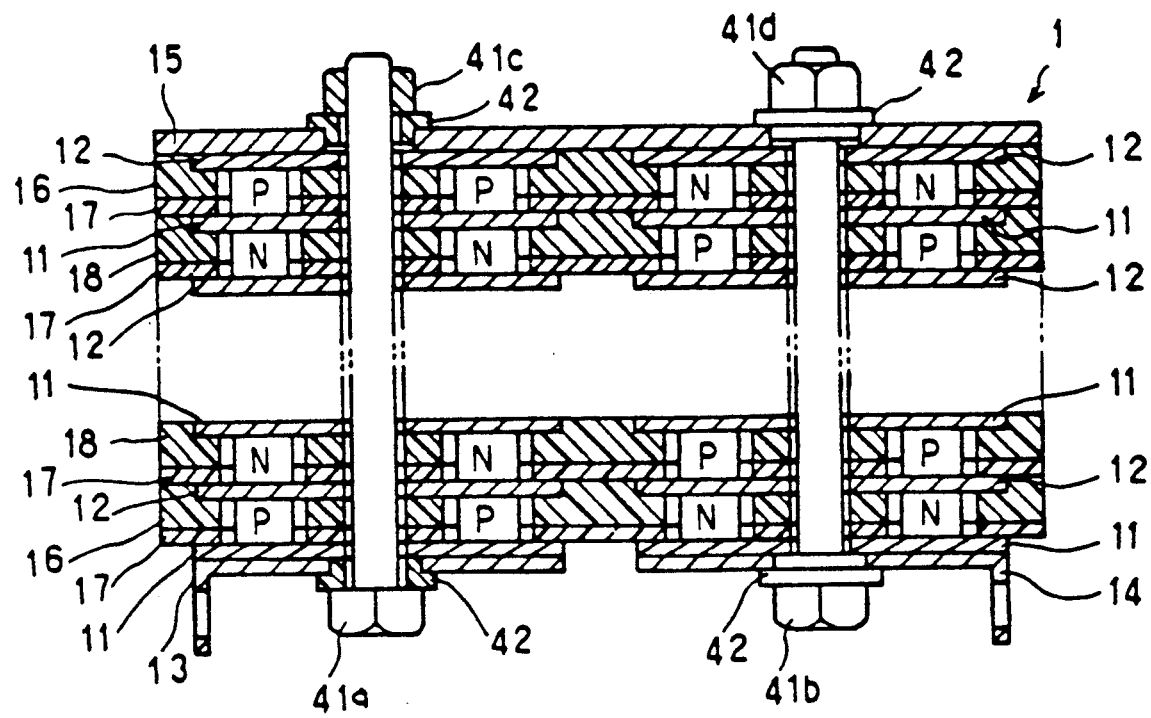
FIG. 20 is a cross sectional view taken along the line 20—20 of FIG. 17 with central portions taken away.

The fourth embodiment of the present invention is described with regard to FIGS. 16 through 20. In FIG. 16, all electrodes 11, 12 have louvers 22 thereon, however, the louvers 22 are shown on just one electrode 11 for convenience. In FIGS. 16 and 20, central portions of the device are not shown.

In FIG. 16, from right to left, an endothermic electrode 11, a spacer 17, a spacer 16, a radiative electrode 12, a spacer 17, a spacer 18, an endothermic electrode 11, a spacer 17, a spacer 16, a radiative electrode 12, a spacer 17, a spacer 18, a endothermic electrode 11 and so on are built up sequentially. The spacers 16, 17 and 18 are made of nonconductive resin material. The endothermic electrodes 11 and the radiative electrodes 12 are aligned in two rows.

At one end of the thermoelectric converter 1, a terminal 13 is disposed at the head of one row of electrodes 11, 12, while the head of the other row has a terminal 14. At the other end of the thermoelectric converter 1 is an electrode plate 15 which connects one row with another row of the electrodes 11, 12. These elements described above are tightened by two bolts 41a, 41b.

Figure 17:
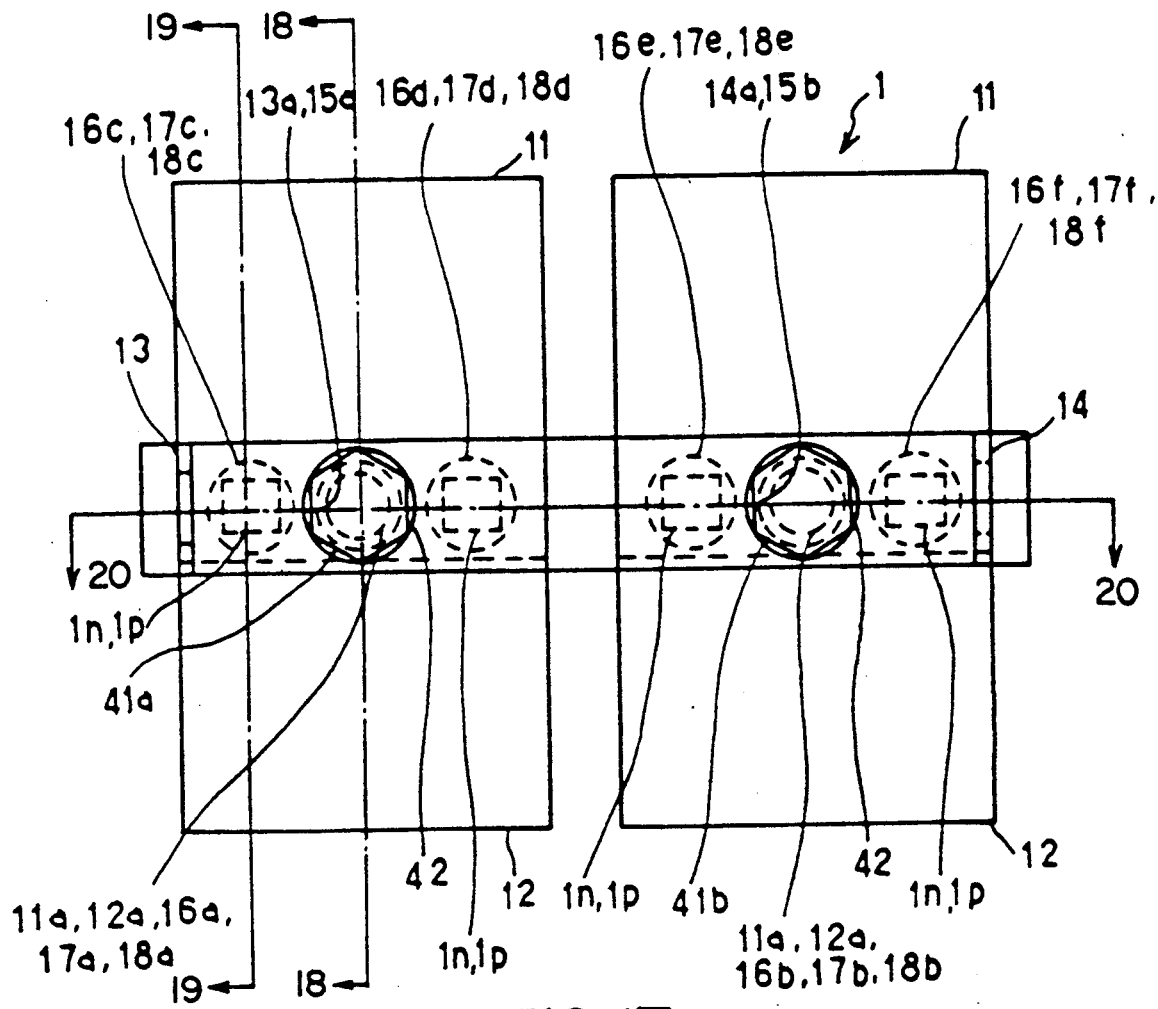
FIG. 17 is a side view of the fourth embodiment.

In FIG. 17, the electrodes 11, 12 have holes 11a, 12a into which the bolts 41a, 41b are inserted. The spacers 16, 17, 18 have holes 16a, 17a, 18a, 16b, 17b, 18b into which the bolts 41a, 41b are inserted. The terminal 13, 14 and terminal plate 15 have holes 13a, 14a, 15a, 15b into which the bolts 41a, 41b are inserted.

Nonconductive collars 42 are disposed between the bolts 41a, 41b and the terminals 13 14 and between the nuts 41c, 41d and the terminal plate 15. As shown in FIG. 19 and FIG. 20, the N-type thermoelectric element 1n or the P-type thermoelectric element 1p is disposed between the endothermic electrode 11 and the radiative electrode 12.

The spacers 16, 17, 18 have holes 16c, 16d, 16e, 16f, 17c, 17d, 17e, 17f, 18c, 18d, 18e, 18f in which the N-type thermoelectric element 1n or the P-type thermoelectric element 1p is disposed.

A voltage is applied to the positive and negative terminals 13, 14 in FIG. 20. Current flows from the terminal 13 in parallel through two rows of the P-type and N-type thermoelectric elements, which are on opposite sides of bolt 41a, to plate 15. Plate 15 carries the current to the right side where it flows in parallel through another two rows of the P-type and N-type thermoelectric elements, which are on opposite sides of bolt 41b, to terminal 14. The endothermic electrodes 11 absorb the heat and the radiative electrode 12 radiates the heat.

The way of assembling the thermoelectric converter 1 is described hereinafter.

A solder coating is formed on surfaces of the electrodes 11, 12 which contact the thermoelectric elements 1p, 1n. The electrodes 11, 12, the spacers 16, 17, 18, the thermoelectric elements 1p, 1n, the terminals 13, 14, 15 and the collars 42 are built up sequentially and are tied by the bolts 41a, 41b and the nuts 41/c, 41d. The assembled thermoelectric converter 1 is heated to about 180° C. to melt the solder coating on the electrodes 11, 12 and then cooled down to solidify the melted solder and fix the thermoelectric elements 1p, 1n to the electrode 11, 12.

The spacers 16, 17, 18 made from elastic resin make the electrodes 11, 12 contact the thermoelectric elements 1p, 1n firmly by an elasticity thereof. Adhesive can be applied on the surfaces of the spacers 16, 17, 18 to bond them firmly. The choice of adhesive must be such that the adhesive will not cure during the soldering operation even if the temperature is under 180° C. After the soldering operation the adhesive is cured by lowering the temperature suitably.

Since two rows of the thermoelectric elements 1p, 1n are provided to one row of electrodes 11, 12, the number of thermoelectric elements is increased (doubled) and a large amount of heat transfer is achieved.

The spacers 16, 17, 18 insulate the radiative electrodes 12 from the endothermic electrodes 11 thermally and electrically. The high mechanical strength of the thermoelectric converter is achieved by the spacers 16, 17, 18 because the spacers 16, 17, 18 combine two rows of the electrodes.

The spacers 16, 18 are L-shaped in cross section as shown in FIG. 18. The spacers 16 cover the end of the radiative electrodes 12 and the spacers 18 cover the end of the endothermic electrodes 11 in order to prevent short circuit between the radiative electrode 12 and the endothermic electrode 11 due to condensed water when the thermoelectric converter is used for cooling or drying air.

Figure 21:
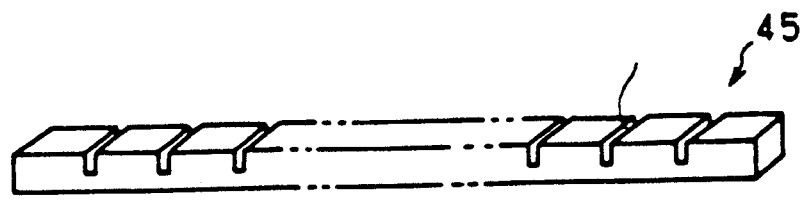
FIG. 21 is a perspective view of a holding member used for the fourth embodiment with central portions taken away.

FIG. 21 shows a holder 45 for holding the electrodes 11, 12 to prevent them from deforming. The holder 45 has slots 451 the number of which corresponds to the number of the endothermic electrodes 11 or the radiative electrode 12 and into which each electrode is inserted respectively. The holder 45 keeps the interval of adjacent electrodes and prevents a short circuit due to the deforming of the electrodes.

Figure 22:
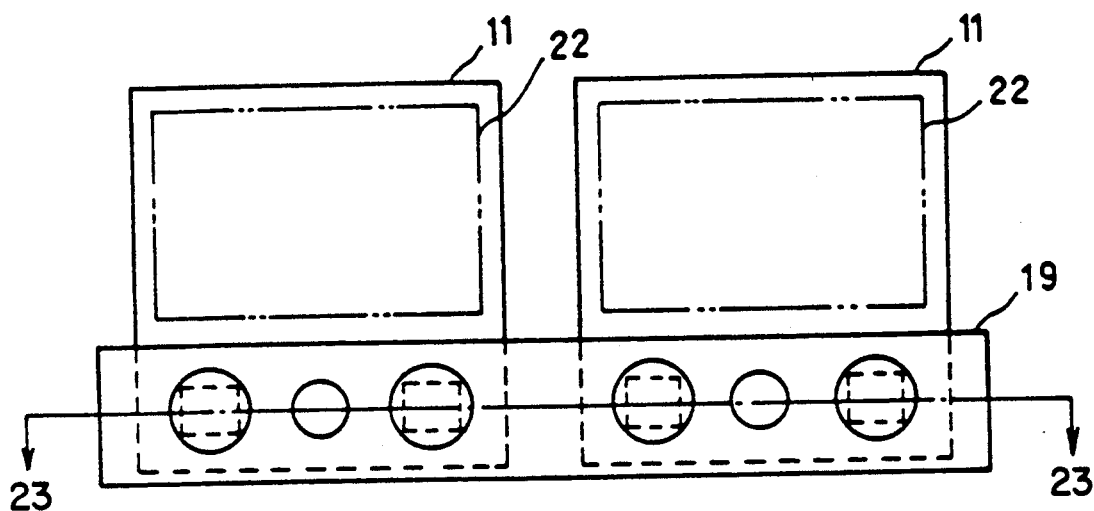
FIG. 22 is a front view of another modification of the fourth embodiment.
Figure 23:
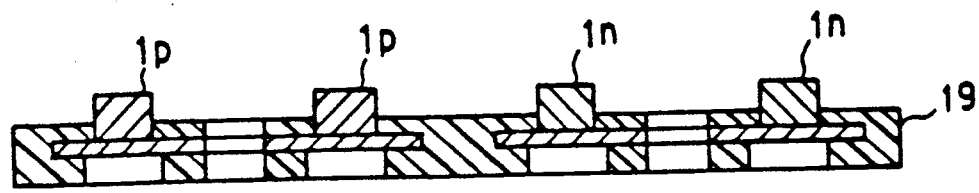
FIG. 23 is a cross sectional view taken along the line 23—23 of FIG. 22.
Figure 30:
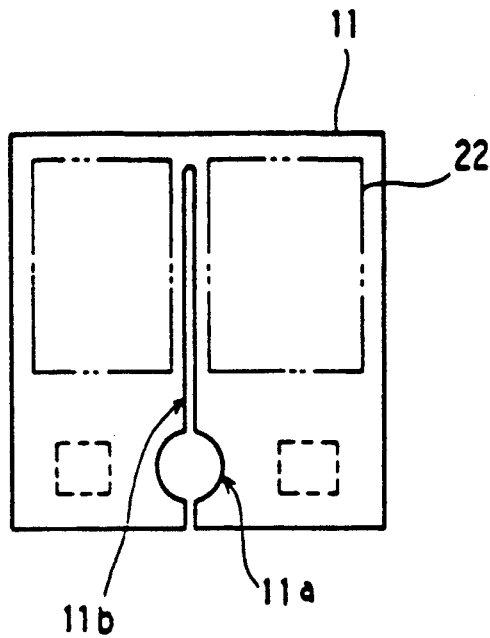
Figure 31:
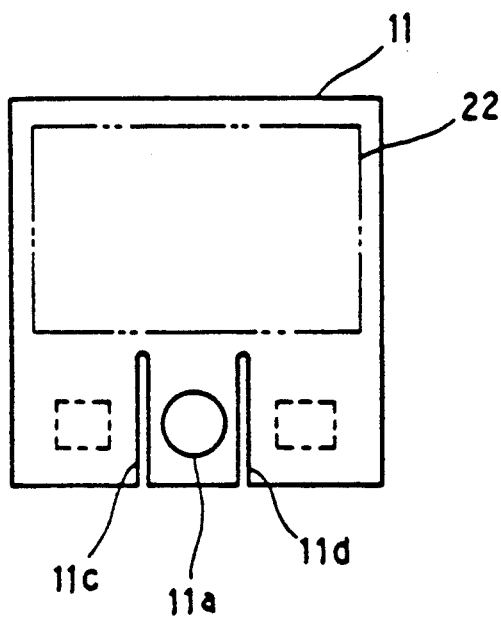

FIGS. 22 and 23 show that the endothermic electrode 11 is molded in a resin spacer 19. The thermoelectric elements 1p, 1n are soldered to one surface of the endothermic electrode 11 which have louvers 22. The radiative electrode 12 is also molded in a resin spacer 19. According to this structure, the electrodes 11, 12 can be easily assembled to the spacer 19, and the clearance between the spacer 19 and the electrodes 11, 12 become small. The electrodes 11, 12 expand and contract due to heat radiation and absorption and the thermoelectric elements 1p, 1n are fixed on the electrodes 11, 12 by soldering, so that some stress arises at the contacting surfaces of the thermoelectric elements 1p, 1n and the electrodes 11, 12. The electrode 11 shown in FIG. 30 has a slit 11b in a center portion thereof to absorb expansion and contraction and reduce stress. The electrode 11 shown in FIG. 31 has two slits 11c, 11d at both sides of the hole 11a for the same purpose.

THE FIFTH EMBODIMENT

Figure 24:
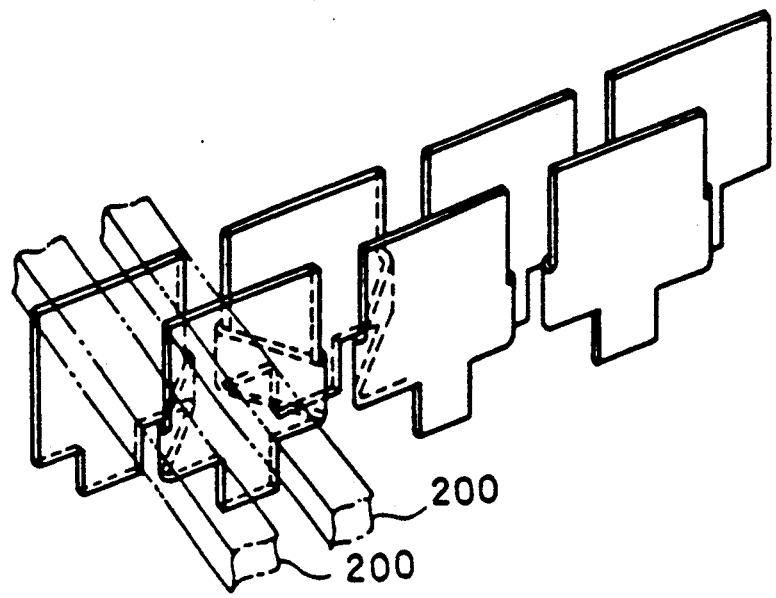
FIG. 24 is a perspective view of parts of the fifth embodiment.
Figure 25:
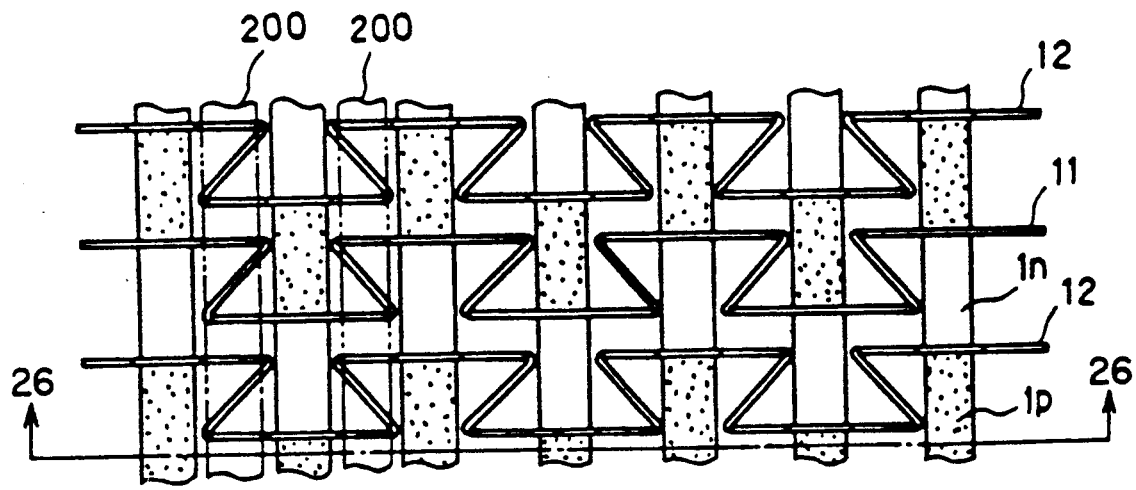
FIG. 25 is a plain view of the fifth embodiment.
Figure 26:
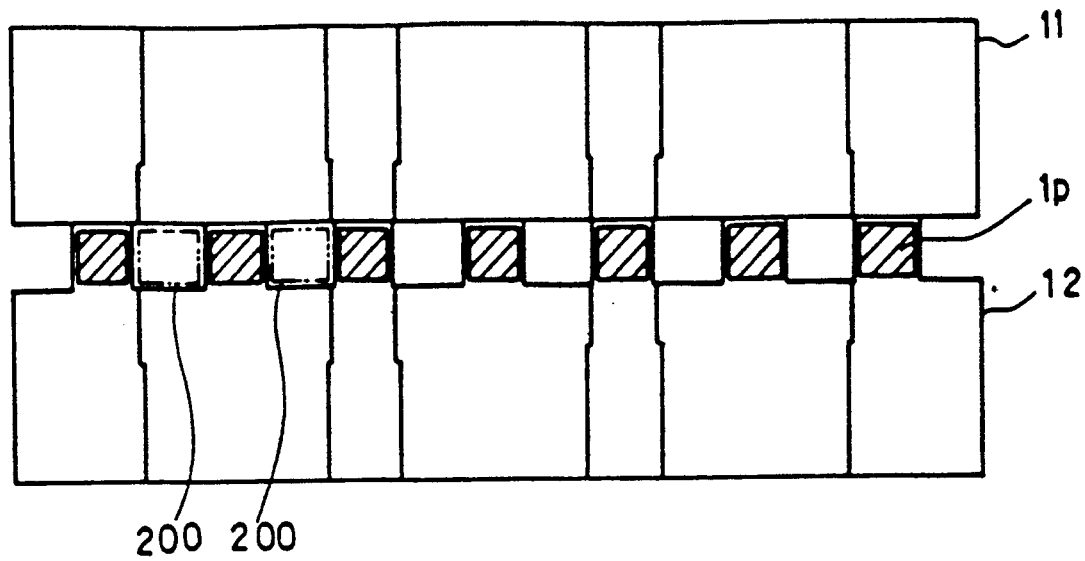
FIG. 26 is a cross sectional view taken along the line 26—26 of FIG. 25.

FIGS. 24 through 26 show the fifth embodiment of the present invention. The electrodes 11, 12 are bent zigzag and the P-type thermoelectric element 1p and the N-type thermoelectric element 1n are attached thereto. Spacers 200 are disposed between the P-type thermoelectric element 1p and the N-type thermoelectric element 1n to insulate therebetween thermally and electrically. All of the thermoelectric elements 1p, 1n are connected in parallel.

The invention is not to be limited to the foregoing since further variations in the invention will become apparent to those skilled in the art and such are to be included in accordance with the scope of this invention as defined by the following claims.

What is claimed is:

1. A thermoelectric converter comprising:
   a thermoelectric converting portion having an N-type thermoelectric element, a first electrode, and a P-type thermoelectric element and a second electrode which are stacked sequentially in the order stated in a way such that said first electrode completely separates said N-type thermoelectric element from said P-type thermoelectric element, being in contact with and separating adjacent and opposite surfaces of said N-type and P-type thermoelectric elements, respectively;
   one of said electrodes being an endothermic electrode and the other being a radiative electrode;
   endothermic means thermally connected to the endothermic electrode for absorbing heat; and
   radiative means thermally connected to the radiative electrode for radiating heat.

2. A thermoelectric converter comprising:
   a first electrode having one surface;
   an N-type thermoelectric element having first and second opposite surfaces, the first surface being coupled to said one surface of said first electrode;
   a second electrode having first and second opposite surfaces, the first of which is coupled to said second surface of the N-type thermoelectric element;
   a P-type thermoelectric element which has one surface coupled to the said second surface of the second electrode in a location adjacent a coupled location of said N-type thermoelectric element on said second electrode;
   one of said electrodes being an endothermic electrode and the other being a radiative electrode;
   endothermic means thermally connected to the endothermic electrode for absorbing heat; and
   radiative means thermally connected to the radiative electrode for radiating heat.

3. A thermoelectric converter comprising:
   two rows of thermoelectric converting portions, each thermoelectric converting portion having an N-type thermoelectric element, a first electrode, a P-type thermoelectric element and a second electrode which are stacked sequentially from one side to another side of each row in the order stated, in a way such that said first electrode completely separates said N-type thermoelectric element from said P-type thermoelectric element, being contact with and separating adjacent and opposite surfaces of said N-type and P-type thermoelectric elements, one of said electrodes being an endothermic electrode and the other being a radiative electrode;
   connecting means for connecting electrically one row of thermoelectric converting portions with the other row of thermoelectric converting portions at the same sides thereof;
   endothermic means thermally connected to the endothermic electrode for absorbing heat; and
   radiative means thermally connected to the radiative electrode for radiating heat.

4. A thermoelectric converter as in claim 1, 2 or 3, wherein a plurality of the P-type thermoelectric elements are attached to each endothermic electrode and an adjacent radiative electrode and a plurality of the N-type thermoelectric elements are attached to each radiative electrode and adjacent endothermic electrode.

5. A thermoelectric converter as in claim 1, 2 or 3, wherein the endothermic means and the radiative means comprise louvers which are formed on the endothermic electrode and the radiative electrode.

6. A thermoelectric converter as in claim 1, 2 or 3, wherein the endothermic means and the radiative means comprise corrugated fins which are attached to the endothermic electrode and the radiative electrode.

7. A thermoelectric converter as in claim 1, 2 or 3, wherein the endothermic means and the radiative means comprise heat pipes which are thermally connected to the endothermic electrode and the radiative electrode respectively.

8. A thermoelectric converter of claim 1, 2 or 3 further comprising an insulator which insulates the radiative means from the endothermic means thermally and electrically.

9. A thermoelectric converter as in claim 1, 2 or 3 wherein said electrodes are U-shaped.

10. A thermoelectric converter as in claim 1, 2 or 3 wherein said electrodes are fan shaped.

11. A thermoelectric converter as in claim 1, 2 or 3 wherein each of said electrodes comprises a pair of parallel plates.

12. A thermoelectric converter as in claim 1, 2 or 3 wherein said electrodes are comb shaped.

13. A thermoelectric converter as in claim 1, 2 or 3 wherein said electrodes are zig-zag shaped.

14. A thermoelectric converter as in claim 1, 2 or 3 wherein each said electrode comprises a plurality of fingers adjacent ones of which are bent outward in opposite directions.

15. A thermoelectric converter as in claim 1, 2 or 3 wherein said electrodes are oriented at an acute angle relative to a direction of alignment of said thermoelectric elements.

16. A thermoelectric converter as in claim 4 wherein said electrodes have a slit in a center portion thereof for compensating for mechanical expansion and contraction.

17. A thermoelectric converter as in claim 4 wherein said electrodes have two slits in a center portion thereof for compensating for mechanical expansion and contraction.

18. A thermoelectric converter as in claim 3, wherein two N-type thermoelectric elements are connected to one surface of the first electrode and two P-type thermoelectric elements are connected to the other surface of the first electrode.

19. A method of exchanging heat comprising the steps of:
   making a thermoelectric converting portion having an N-type thermoelectric element, a first electrode, a P-type thermoelectric element and a second electrode which are stacked sequentially in the order stated, so that said first electrode is completely between said N-type thermoelectric element and said P-type thermoelectric element and in contact with adjacent surfaces of said N and P-type and thermoelectric elements, one of said electrodes being an endothermic electrode and the other being a radiative electrode;
   connecting an endothermic means to said endothermic electrode;
   applying current to said thermoelectric converting portion in a direction of stacking thereof, so that said endothermic means absorbs heat and the radiative electrode radiates heat.

20. A thermoelectric converter as in claim 1, 2, or 3, wherein said N-type and P-type thermoelectric elements and said first and second electrodes are disposed with respect to a direction of stacking thereof.

21. A thermoelectric converter as in claim 1, 2 or 3, wherein said N-type and P-type thermoelectric elements and said first and second electrodes are inclined and non perpendicular with respect to a direction of stacking thereof.

22. A thermoelectric converter as in claim 2 further comprising:
 a third electrode having a first surface connected to a second surface, opposite to said first surface, of said P-type thermoelectric element;
 a second N-type thermoelectric element connected to a second surface of said third electrode opposite to said first surface;
 wherein a plane which would be formed in a direction of resultant current flow passing through at least a portion of all of said thermoelectric elements.

23. A thermoelectric converter as in claim 2 further comprising:
 a second P-type thermoelectric element connected to a second surface, opposite to said first surface, of said first electrode.

24. A thermoelectric converter as in claim 1, wherein said first electrode is a flat electrode having a width defined between surfaces to which said N-type thermoelectric element and said P-type thermoelectric element are coupled, and said thermoelectric converting portion is stacked such that resultant current flow is in a direction of stacking and in a direction of said width of said first electrode.

25. A thermoelectric converter as in claim 2, wherein said second electrode is a flat electrode having a width defined between said first and second surfaces, and said thermoelectric converting portion is stacked such that resultant current flow is in a direction of stacking and in a direction of said width of said second electrode.

26. A thermoelectric converter as in claim 3, wherein each said first electrode is a flat electrode having a width defined between surfaces to which said N-type thermoelectric element and said P-type thermoelectric element are coupled, and said thermoelectric converting portion is stacked such that resultant current flow is in a direction of stacking and in a direction of said width of said each first electrode.

27. A method as in claim 19, wherein said first electrode is a flat electrode having a width defined between surfaces to which said N-type thermoelectric element and said P-type thermoelectric element are coupled, and said thermoelectric converting portion is stacked such said applying current step forms resultant current flow in a direction of stacking and in a direction of said width of said first electrode.

28. A thermoelectric converter as in claims 1 or 3, wherein said first electrode is in contact with an entirety of one face of both of said N and P thermoelectric elements.

29. A thermoelectric converter as in claim 2, wherein said second electrode is in contact with an entirety of one face of both of said N and P thermoelectric elements.

* * * * *